United States Patent
Fontaine et al.

(10) Patent No.: US 6,515,272 B1
(45) Date of Patent: Feb. 4, 2003

(54) METHOD AND APPARATUS FOR IMPROVING SIGNAL TO NOISE RATIO OF AN AERIAL IMAGE MONITOR

(75) Inventors: Bruno La Fontaine, Pleasanton; Harry Levinson, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 103 days.

(21) Appl. No.: 09/675,534

(22) Filed: Sep. 29, 2000

(51) Int. Cl.$^7$ ............................................. H01L 27/00
(52) U.S. Cl. ............................. 250/208.1; 250/214 A; 250/559.05
(58) Field of Search .................. 250/208.1, 214 A, 250/214 R, 214 LA, 548, 559.05; 356/399–401; 382/203, 204; 355/53, 55

(56) References Cited

U.S. PATENT DOCUMENTS

| | | | |
|---|---|---|---|
| 5,491,724 A | 2/1996 | Altes | 375/322 |
| 5,631,731 A | 5/1997 | Sogard | 356/121 |
| 5,866,935 A | 2/1999 | Sogard | 257/435 |
| RE36,509 E * | 1/2000 | Shigihara | 348/564 |

FOREIGN PATENT DOCUMENTS

| | | |
|---|---|---|
| CA | 1211802 | 9/1986 |
| EP | 0119711 B1 | 9/1984 |
| EP | 0119711 A1 | 9/1984 |

OTHER PUBLICATIONS

Stanford Research Catalogue (2000), Application Note#3, pp 169–179 (Month Unknown).

C.H. Fields, W.G. Oldham, A.K. Ray–Chaudhuri, K.D. Krenz, R.H. Stulen, Direct Aerial Image Measurements To Evaluate The Performance Of An Extreme Ultraviolet Projection Lithography System, J. Vac. Sci. Technol. B 14(6), Nov./Dec. 1996, American Vacuum Society, pp. 4000–4003.

* cited by examiner

*Primary Examiner*—Que T. Le (57) ABSTRACT

In an image monitoring apparatus, a pulsed-laser signal is modulated at a chosen frequency. The modulated signal is provided to an optical imaging system, the output signal is detected by an aerial image detector, and the signal from the aerial image detector is in turn amplified only at the chosen frequency. The apparatus includes an optical chopper for modulating the pulsed-laser signal, and a lock-in amplifier for amplifying the signal from the aerial image detector.

13 Claims, 8 Drawing Sheets

Figure 9

METHOD AND APPARATUS FOR IMPROVING SIGNAL TO NOISE RATIO OF AN AERIAL IMAGE MONITOR

BACKGROUND OF THE INVENTION

1. Field of the Invention

This invention relates generally to optical imaging characterization, and more particularly, to a method and apparatus for improving the signal to noise ratio of optical imaging for use in the characterization of imaging systems used in the semiconductor industry.

2. Discussion of the Related Art

Figure 1:
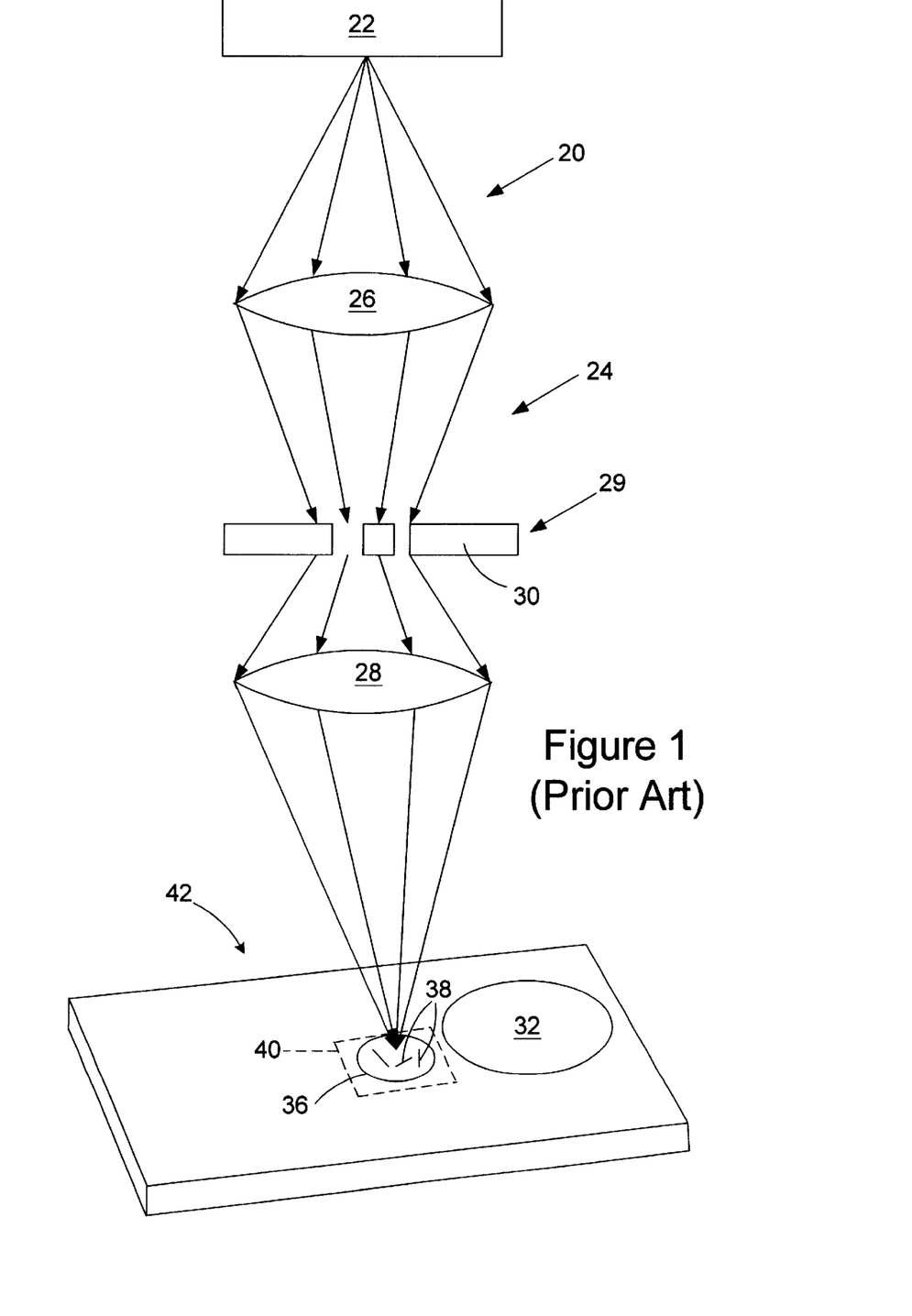
FIG. 1 illustrates a prior art optical projection lithography stepper apparatus.

FIG. 1 illustrates a prior art optical stepper lithography apparatus 20. In typical semiconductor chip processing configuration, a pulsed-laser signal source 22 provides a signal made up of a plurality of successive pulses at a given pulse frequency or repetition rate R. The pulses are provided to a lithographic imaging system 24 including lenses 26, 28 imaging a reticle positioned at the station 29 onto a wafer 32 on a stage 34. Also mounted on the stage 34 is a slit plate 36 which contains several slits 38, each oriented in a different direction, and a photodetector 40 beneath the slit plate 36.

Figure 2:
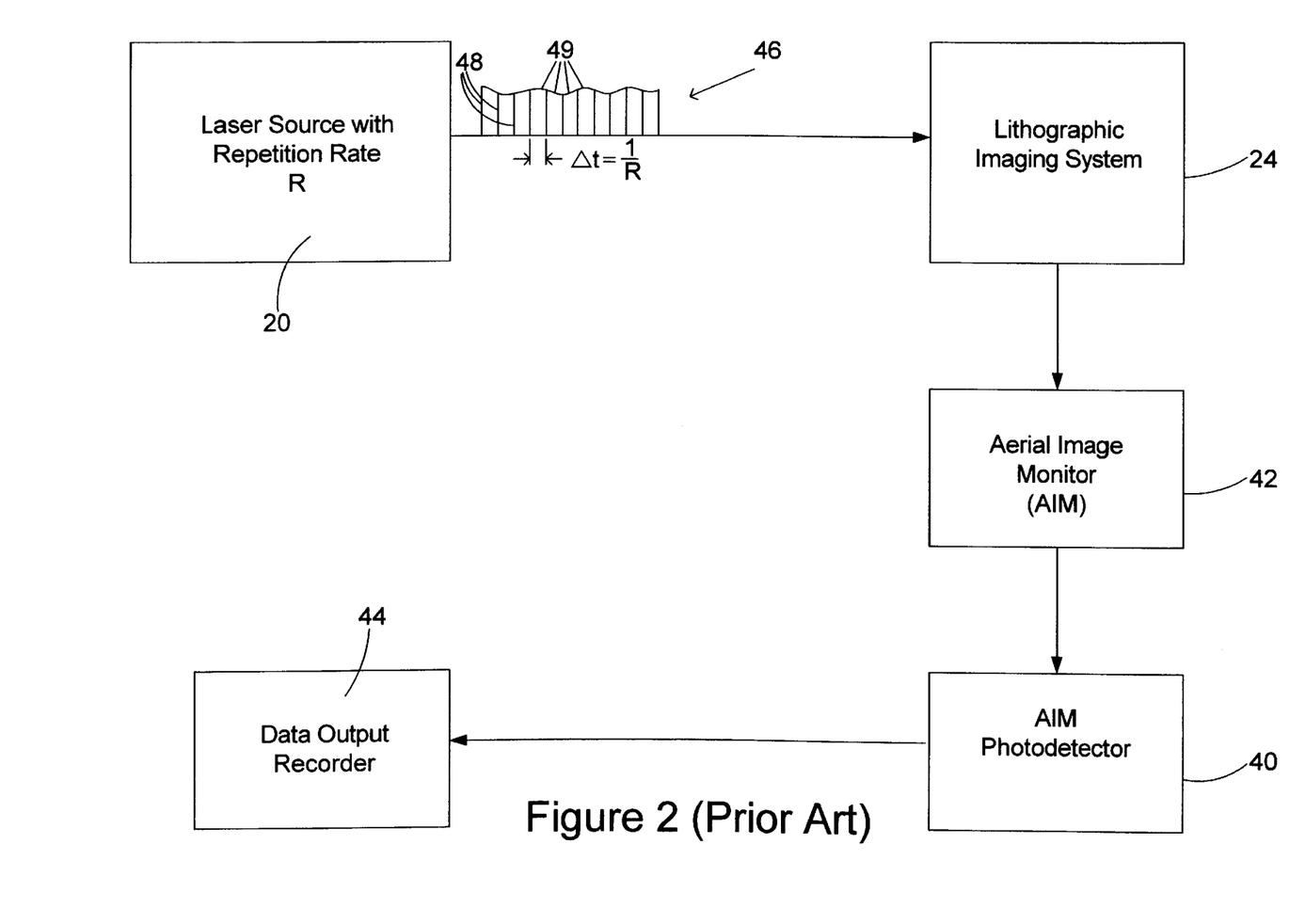
FIG. 2 is a schematic view of the optical projection lithography stepper apparatus of FIG. 1.

In the use of the apparatus 20 of FIG. 1, and also with reference to FIG. 2, the apparatus 20 is used for measuring optical performance of a stepper. The reticle is replaced with a test reticle 30 is positioned at the station 29. The stage 34 is positioned as shown in FIG. 1 with the test reticle 30 imaged on the slit plate 36. The slit 38 is then moved or scanned across the image plane, the longitudinal axis of the slit 38 being held perpendicular to the scan direction. During the scanning operation, the intensity of the transmission through the slit 38 is monitored by means of photodetector 40, which, with the slit plate 36, makes up an aerial image monitor 42. The intensity profile measured by the photodetector 40 is provided to a data output recorder 44 and is compared to a previously calculated profile expected from a "perfect" stepper or to a baseline measurement. From this comparison the performance characteristics of the apparatus 20 are determined.

As the dimensions of features being printed with lithography systems get smaller and smaller, the requirements on the precision of aerial image monitors become more and more severe, and the available source power tends to decrease, leading to smaller signal levels. High precision can only be achieved with a high signal to noise ratio, i.e., a high ratio of the pulsed-laser signal detected intensity to the intensity of the noise that is detected, so that small changes in the signal corresponding to small variations in the intensity of the aerial image can be recorded Again referring to FIG. 2, as noted above, the signal 46 from the pulsed-laser source 22 is provided as a series of pulses 48 at a given repetition rate R. Because each pulse 48 tends to have a slightly different intensity, the laser output signal exhibits noise over a wide frequency range.

Figure 3:
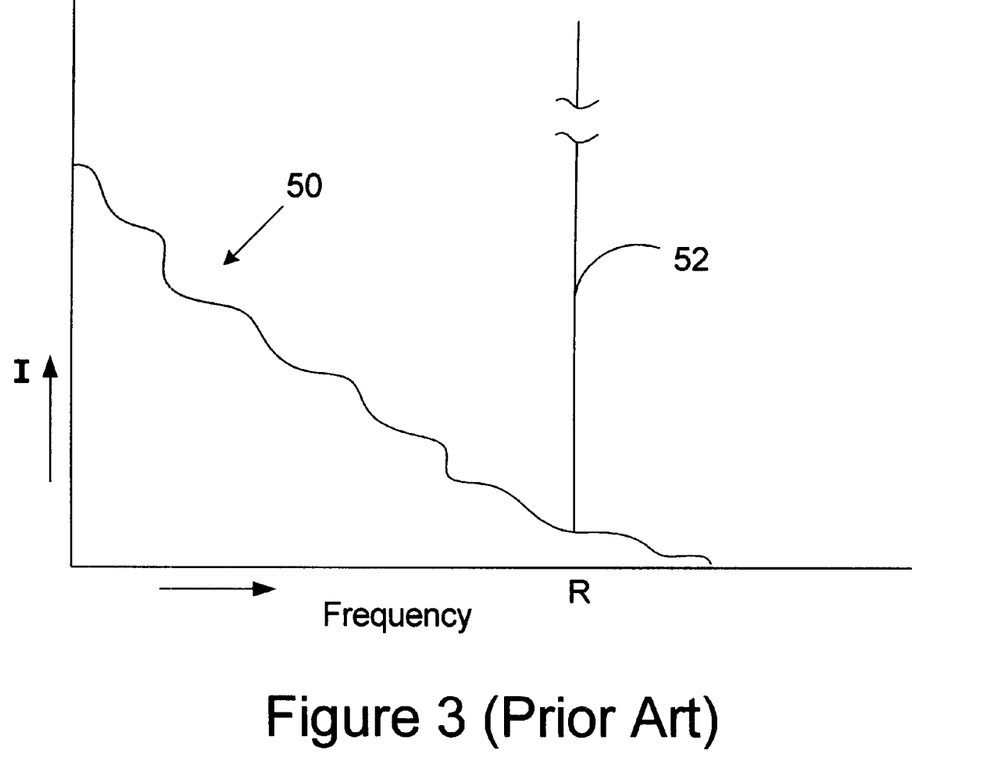
FIG. 3 is a frequency spectrum of the signal from the pulsed-laser source of the apparatus of FIG. 1.

A typical general noise frequency spectrum (signal intensity I plotted against frequency) of the signal 46 provided by the pulsed-laser source 22 is shown in FIG. 3, indicated by the sloping, irregular line 50. The vertical line 52 indicates the laser pulse rate (or frequency) R.

Figure 4:
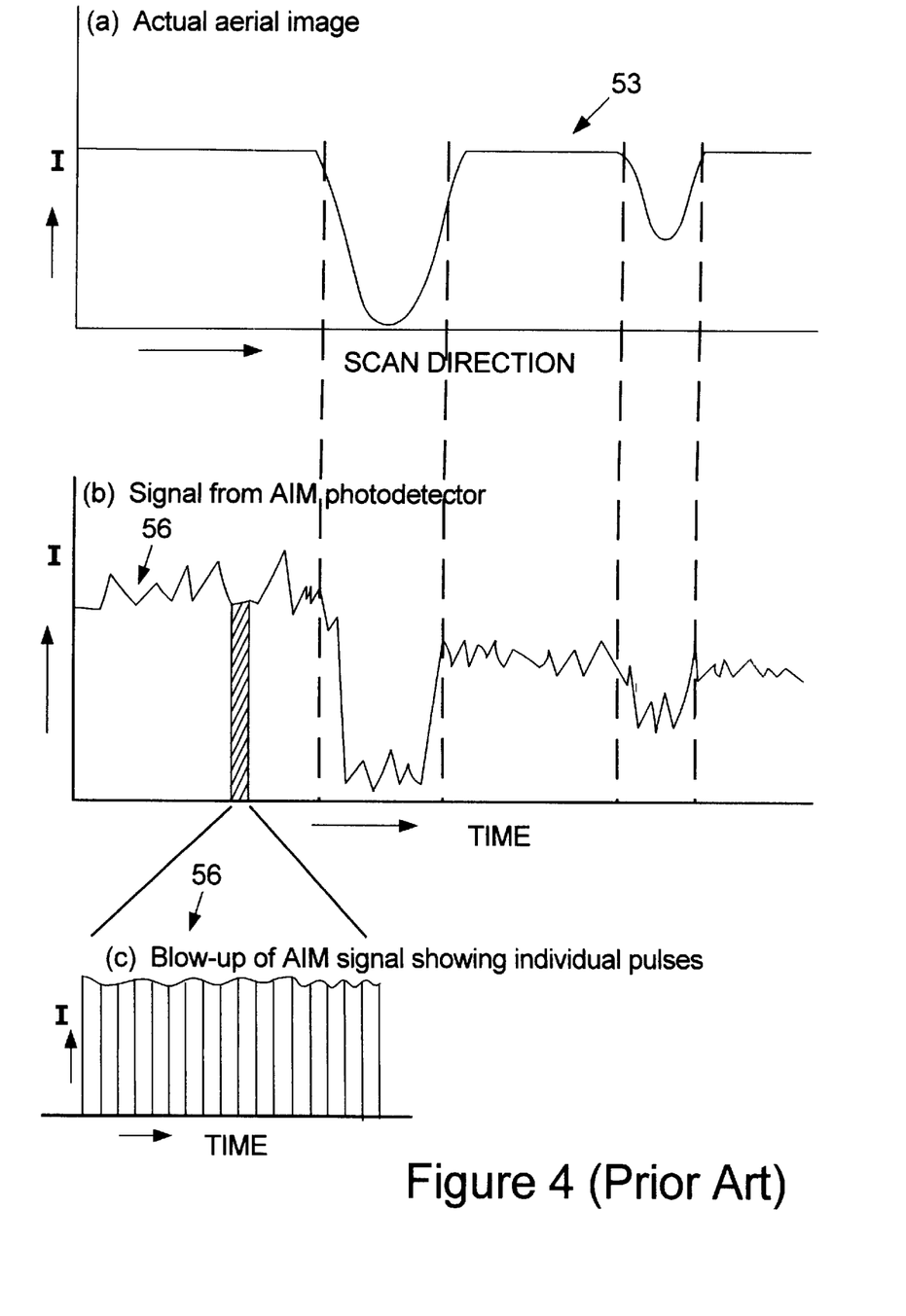
FIG. 4 is a graphical representation of the output signal of the aerial image monitor of the apparatus of FIG. 1 in the time domain, and includes the reference (actual) aerial image produced by the stepper.

FIG. 4(a) illustrates the aerial image 53 produced by the imaging system, and FIG. 4(b) shows the signal 56 produced by the photodetector 40, which is recorded by the data output recorder 44. This signal from the photodetector 40 includes a substantial amount of noise, as shown in FIG. 4(b), which is a graph of signal 56 intensity provided by the photodector 40 to the data output recorder 44 plotted against time.

FIG. 4(c) shows an enlarged view of a short segment of the signal of FIG. 4(b), where individual laser pulses can be distinguished.

With such a poor signal to noise ratio, high precision of the aerial image monitor 42 cannot be achieved.

Therefore, what is needed is a method and apparatus for improving the signal to noise ratio of aerial image monitors for lithography stepper tools used to produce semiconductor devices.

SUMMARY OF THE INVENTION

In the present method for monitoring the image of a stepper imaging system, a pulsed-laser signal is provided, and is modulated at a chosen frequency. The modulated signal it is then provided to an imaging system. An output signal is provided from an aerial image monitor in response to the modulated signal provided to the optical imaging system, and only the component of that signal at the chosen frequency is amplified.

The present image monitoring apparatus includes a signal modulating device in the form of an optical chopper for modulating a laser pulse signal at a chosen frequency. Image monitoring means receive the modulated signal and provide an output signal in response to the modulated signal. A lock-in amplifier amplifies the component of the output signal at the chosen frequency.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiment of the present invention which illustrates the best mode presently contemplated by the inventors for practicing the invention.

Figure 5:
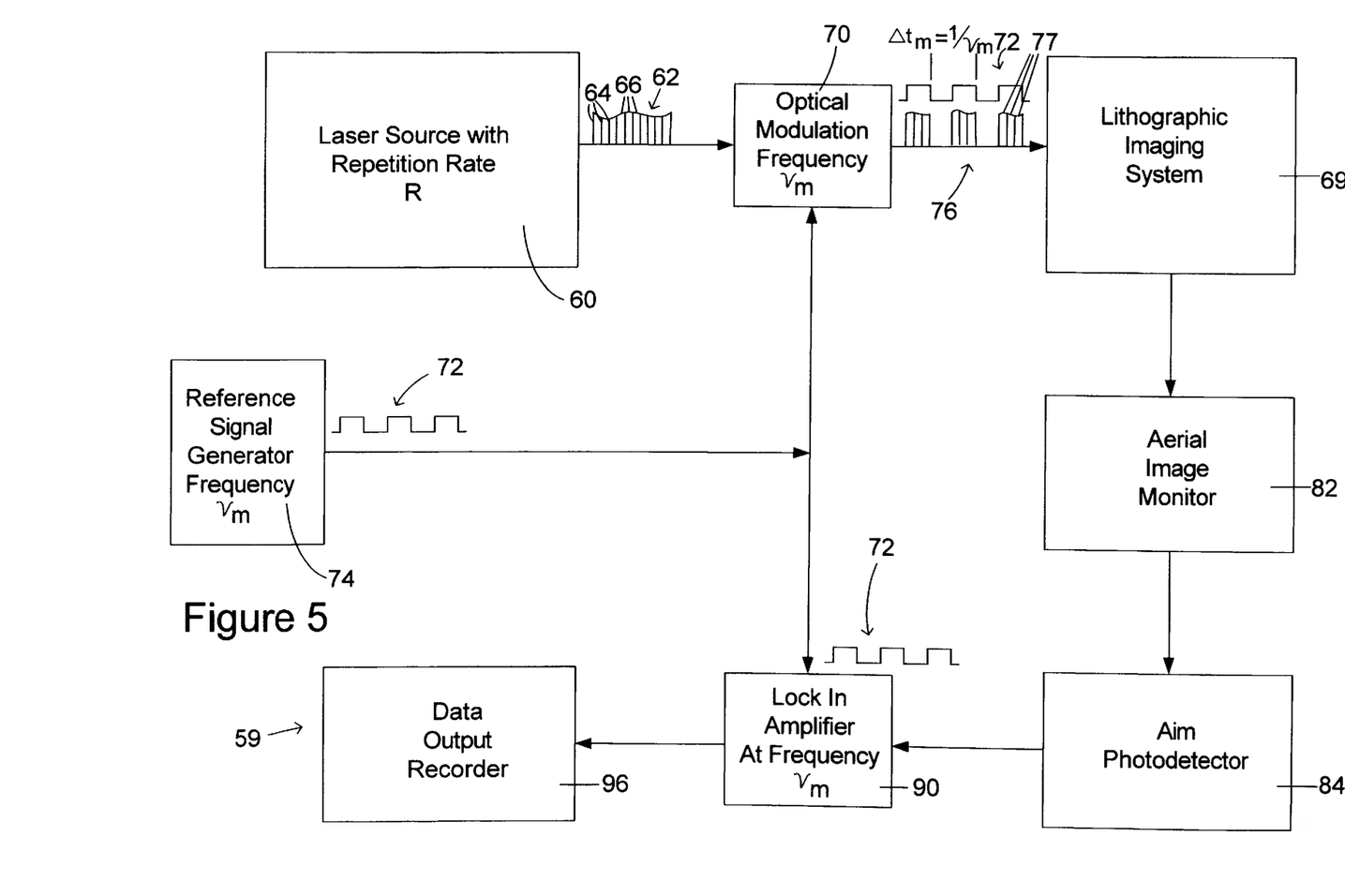
FIG. 5 is a schematic view of the invention, including apparatus for modulating a laser source at a chosen frequency and a lock-in amplifier to extract the signal at that chosen frequency.
Figure 6:
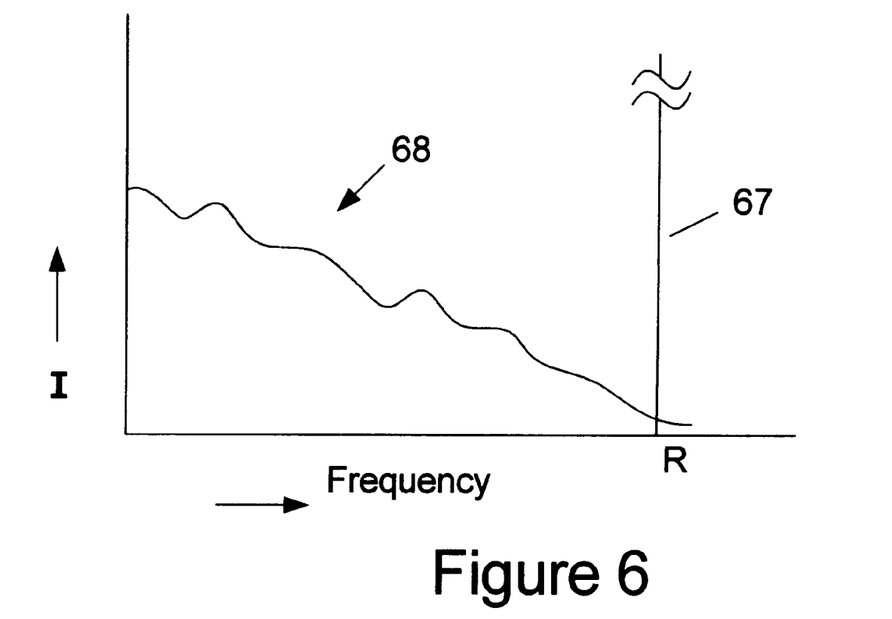
FIG. 6 is a frequency spectrum of the signal from the laser source of the apparatus of FIG. 5.

FIG. 5 illustrates the present inventive apparatus 59. Again, a pulsed-laser signal source 60 provides a signal 62 made up of a plurality of successive pulses 64 at a given repetition rate R. The signal 62 comprises noise 66, as described above, and has a noise frequency spectrum 68 as represented in FIG. 6, similar to that shown in FIG. 3, with the pulsed-laser frequency being indicated at 67. The signal 62, instead of being provided directly to the lithographic imaging system 69, is provided to a signal modulator 70 in the form of an optical chopper interposed between the pulsed-laser source 60 and the lithographic imaging system 69. As alternatives, the signal modulator 70 may be for example an acousto-optical modulator, or an electro-optical modulator.

Figure 7:
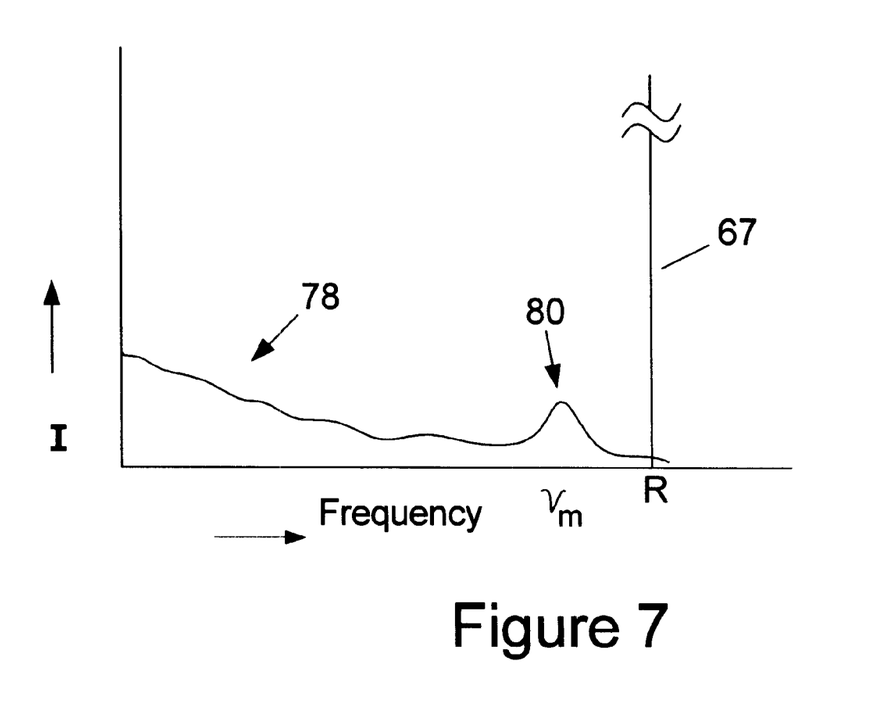
FIG. 7 is a frequency spectrum of the signal out of the optical chopper of the apparatus of FIG. 5.

The optical chopper 70 receives a reference signal 72 at frequency VM from a reference signal generator 74. This signal 72 acts as modulating signal, so that the signal 62 provided from the pulsed-laser source 60 is modulated at a frequency $V_M$, as shown at 76. The signal 76 also has associated noise 77, as seen in the frequency spectrum 78 thereof shown in FIG. 7. Additionally, with the imposition of the modulating signal 72 at frequency $V_M$ on the signal from the pulsed-laser source 60, the intensity of the output signal 76 at frequency $V_M$ has been increased relative to other frequencies as indicated at 80 in FIG. 7.

The modulated signal 76 from the optical chopper 70 is provided to the lithographic imaging system 69 and to the aerial image monitor 82 to be sensed by the photodetector 84.

Figure 8:
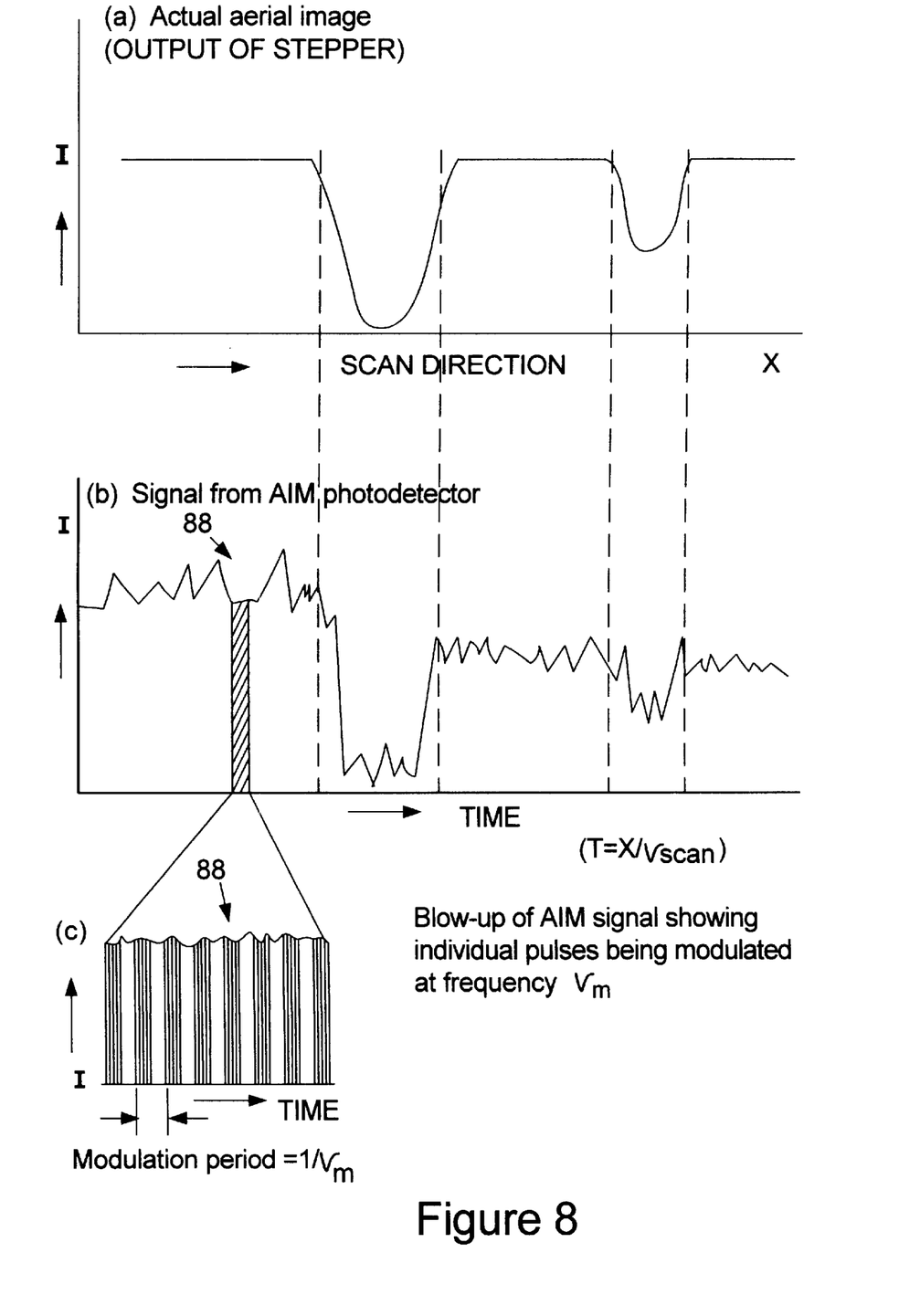
FIG. 8 is a graphical representation of the output signal from the photodetector of the apparatus of FIG. 5 in the time domain, and includes the reference (actual) aerial image produced by the stepper.

FIG. 8(a) again shows the aerial image produced or generated by the imaging system, as was shown in FIG. 4(a). The signal 88 from the photodetector 84 in the time domain is shown in FIG. 8(b). As FIG. 8(c) illustrates, this signal is modulated at frequency $V_M$ because the initial pulsdlaser signal provided to the imaging system was modulated at that frequency vm.

The signal from the photodetector 84 is then provided to a lock-in amplifier 90 which also receives reference signal 72 at frequency $V_M$ from the reference signal generator 74. The lock-in amplifier 90 may be, for example, Stanford Research Systems Model No. SR830.

Figure 9:
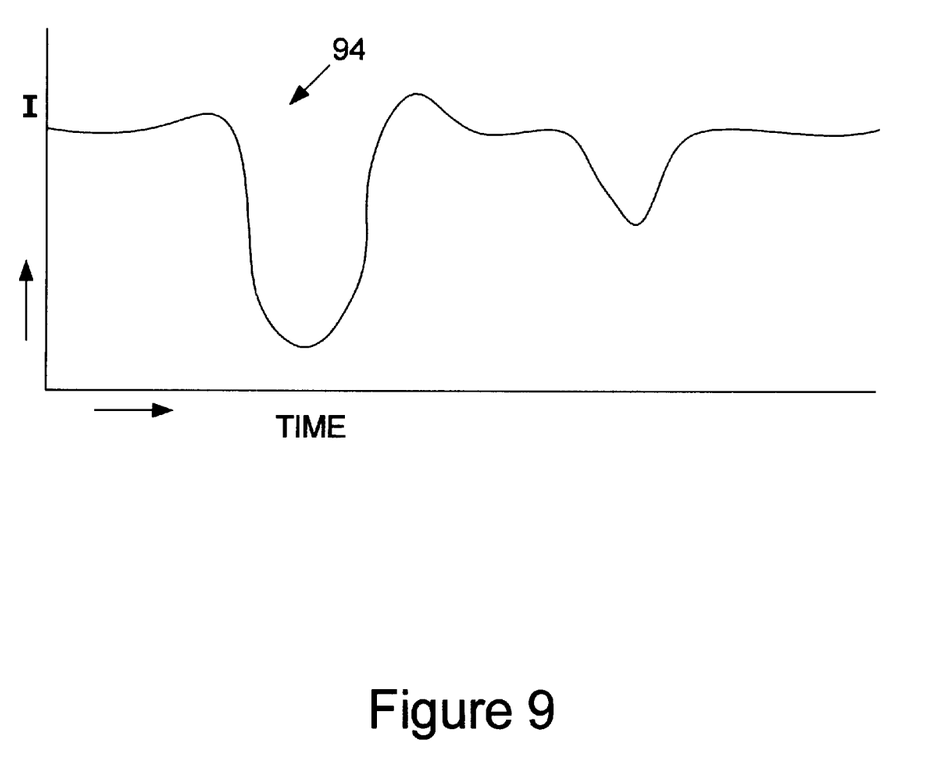
FIG. 9 is a graphical representation of the signal output from the lock in amplifier in the time domain.

The lock-in amplifier 90 amplifies the received signal only at the modulating frequency $V_M$, and filters out spectral components at other frequencies, defining a frequency spectrum with increased signal amplification at frequency $V_M$ relative to other frequencies. This step results in increase in intensity of the signal carried at the modulating frequency $V_M$, while components of the signal at other frequencies (i.e., noise) are being suppressed (see FIG. 9, illustrating the intensity of the signal 94 provided from the lock-in amplifier 90 in the time domain). As a result, the signal to noise ratio of the signal provided to the data output recorder 96 is greatly increased as compared to the prior art.

It will be seen that a method and apparatus for effectively increasing signal to noise ratio of image monitors in imaging apparatus has been provided. The apparatus is readily applied to the environment of production of modern semiconductor devices. The apparatus is simple and effective in use, and the operating precision, accuracy and reliability thereof are improved as compared to the prior art. This leads to improved performance of the apparatus, in turn leading to reduced manufacturing costs.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of monitoring images comprising:

providing a signal;

modulating the signal at a chosen frequency;

providing the modulated signal to an imaging system;

providing an output signal from the imaging system in response to the modulated signal provided to the imaging system; and amplifying the output signal from the imaging system only at the chosen frequency.

2. The method of claim 1 wherein the signal is a pulsed signal.

3. The method of claim 2 wherein the pulsed signal is a pulsed-laser signal.

4. The method of claim 3 wherein the optical imaging system comprises a lithographic imaging system and an aerial image monitor.

5. The method of claim 4 wherein the images are optical images.

6. An imaging apparatus comprising:

a signal modulating device for modulating a signal at a chosen frequency;

imaging means for receiving the modulated signal and providing an output signal therefrom in response to the modulated signal; and an amplifier for amplifying the output signal only at the chosen frequency.

7. The imaging apparatus of claim 6 wherein the signal modulating device is an optical chopper.

8. The imaging apparatus of claim 6 wherein the signal modulating device is an acousto-optical modulating device.

9. The imaging apparatus of claim 6 wherein the signal modulating device is an electro-optical modulating device.

10. The optical imaging apparatus of claim 6 wherein the amplifier comprises a lock-in amplifier.

11. The optical imaging apparatus of claim 6 wherein said apparatus further comprises a pulsed-laser signal source, for providing a pulsed-laser signal to the signal modulating device.

12. The imaging apparatus of claim 6 wherein the imaging means comprise a lithographic imaging system and an aerial image monitor.

13. The imaging apparatus of claim 6 wherein the imaging apparatus is an optical imaging apparatus.

* * * * *